(12) United States Patent  
Roberts et al.

(10) Patent No.: US 8,354,301 B2
(45) Date of Patent: Jan. 15, 2013

(54) PACKAGED MICRODEVICES AND METHODS FOR MANUFACTURING PACKAGED MICRODEVICES

(75) Inventors: Stuart L. Roberts, Boise, ID (US); Tracy V. Reynolds, Boise, ID (US); Rich Fogal, Mccall, ID (US); Matt E. Schwab, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/987,890

(22) Filed: Jan. 10, 2011

(65) Prior Publication Data

US 2011/0104857 A1    May 5, 2011

Related U.S. Application Data

(62) Division of application No. 11/509,990, filed on Aug. 25, 2006, now Pat. No. 7,868,440.

(51) Int. Cl.
*H01L 21/00* (2006.01)
*H01L 21/44* (2006.01)

(52) U.S. Cl. ........ 438/109; 438/112; 438/613; 438/615; 257/E23.063

(58) Field of Classification Search .................. 438/109, 438/110, 112, 613, 615; 257/E23.063
See application file for complete search history.

(56) References Cited

U.S. PATENT DOCUMENTS

| | | | |
|---|---|---|---|
| 5,128,831 A | 7/1992 | Fox, III et al. | |
| 5,180,093 A | 1/1993 | Stansbury et al. | |
| 5,252,857 A | 10/1993 | Kane et al. | |
| 5,518,957 A | 5/1996 | Kim | |
| 5,677,566 A | 10/1997 | King et al. | |
| 5,851,845 A | 12/1998 | Wood et al. | |
| 5,883,426 A | 3/1999 | Tokuno et al. | |
| 5,891,753 A | 4/1999 | Akram | |
| 5,898,224 A | 4/1999 | Akram | |
| 5,925,930 A | 7/1999 | Farnworth et al. | |
| 5,933,713 A | 8/1999 | Farnworth | |
| 5,946,553 A | 8/1999 | Wood et al. | |
| 5,952,716 A | 9/1999 | Dibble et al. | |
| 5,986,209 A | 11/1999 | Tandy | |
| 5,990,566 A | 11/1999 | Farnworth et al. | |
| 6,004,867 A | 12/1999 | Kim et al. | |
| 6,008,070 A | 12/1999 | Farnworth | |

(Continued)

OTHER PUBLICATIONS

Haque, Shatil, "High-power LED Stud-bump Packaging," Advanced Packaging, Apr. 2006.

(Continued)

*Primary Examiner* — Ngan Ngo
(74) *Attorney, Agent, or Firm* — Perkins Coie LLP

(57) ABSTRACT

Microdevices and methods for packaging microdevices. One embodiment of a packaged microdevice includes a substrate having a mounting area, contacts in the mounting area, and external connectors electrically coupled to corresponding contacts. The microdevice also includes a die located across from the mounting area and spaced apart from the substrate by a gap. The die has an integrated circuit and pads electrically coupled to the integrated circuit. The microdevice further includes first and second conductive elements in the gap that form interconnects between the contacts of the substrate and corresponding pads of the die. The first conductive elements are electrically connected to contacts on the substrate, and the second conductive elements are electrically coupled to corresponding pads of the die. The first conductive elements are attached to the second conductive elements at corresponding interfaces such that the interconnects connect the contacts of the substrate directly to corresponding pads on the die within the gap.

23 Claims, 3 Drawing Sheets

U.S. PATENT DOCUMENTS

| | | | |
|---|---|---|---|
| 6,020,624 A | 2/2000 | Wood et al. | |
| 6,020,629 A | 2/2000 | Farnworth et al. | |
| 6,022,757 A | 2/2000 | Andoh | |
| 6,025,648 A | 2/2000 | Takahashi et al. | |
| 6,028,365 A | 2/2000 | Akram et al. | |
| 6,048,755 A | 4/2000 | Jiang et al. | |
| 6,051,878 A | 4/2000 | Akram et al. | |
| 6,072,233 A | 6/2000 | Corisis et al. | |
| 6,072,236 A | 6/2000 | Akram et al. | |
| 6,081,429 A | 6/2000 | Barrett | |
| 6,089,920 A | 7/2000 | Farnworth et al. | |
| 6,097,087 A | 8/2000 | Farnworth et al. | |
| 6,107,122 A | 8/2000 | Wood et al. | |
| 6,124,634 A | 9/2000 | Akram et al. | |
| 6,147,411 A | 11/2000 | Kinsman | |
| 6,153,924 A | 11/2000 | Kinsman | |
| 6,175,149 B1 | 1/2001 | Akram | |
| 6,184,465 B1 | 2/2001 | Corisis | |
| 6,187,615 B1 | 2/2001 | Kim et al. | |
| 6,212,767 B1 | 4/2001 | Tandy | |
| 6,214,642 B1 | 4/2001 | Chen et al. | |
| 6,225,689 B1 | 5/2001 | Moden et al. | |
| 6,228,548 B1 | 5/2001 | King et al. | |
| 6,228,687 B1 | 5/2001 | Akram et al. | |
| 6,235,552 B1 | 5/2001 | Kwon et al. | |
| 6,235,554 B1 | 5/2001 | Akram et al. | |
| 6,239,496 B1 | 5/2001 | Asada | |
| 6,258,623 B1 | 7/2001 | Moden et al. | |
| 6,261,865 B1 | 7/2001 | Akram | |
| 6,281,577 B1 | 8/2001 | Oppermann et al. | |
| 6,291,894 B1 | 9/2001 | Farnworth et al. | |
| 6,294,839 B1 | 9/2001 | Mess et al. | |
| 6,297,547 B1 | 10/2001 | Akram | |
| 6,303,981 B1 | 10/2001 | Moden | |
| 6,310,390 B1 | 10/2001 | Moden | |
| 6,326,697 B1 | 12/2001 | Farnworth | |
| 6,326,698 B1 | 12/2001 | Akram | |
| 6,329,222 B1 | 12/2001 | Corisis et al. | |
| 6,331,221 B1 | 12/2001 | Cobbley | |
| 6,346,434 B1 | 2/2002 | Andoh | |
| 6,382,495 B2 | 5/2002 | Gotoh et al. | |
| 6,407,381 B1 | 6/2002 | Glenn et al. | |
| 6,429,528 B1 | 8/2002 | King et al. | |
| 6,503,780 B1 | 1/2003 | Glenn et al. | |
| 6,548,376 B2 | 4/2003 | Jiang | |
| 6,552,910 B1 | 4/2003 | Moon et al. | |
| 6,560,117 B2 | 5/2003 | Moon et al. | |
| 6,570,469 B2 | 5/2003 | Yamada et al. | |
| 6,576,531 B2 | 6/2003 | Peng et al. | |
| 6,603,210 B2 | 8/2003 | Kishimoto et al. | |
| 6,607,937 B1 | 8/2003 | Corisis | |
| 6,622,380 B1 | 9/2003 | Grigg | |
| 6,762,075 B2 | 7/2004 | Kishimoto et al. | |
| 6,768,190 B2 | 7/2004 | Yang et al. | |
| 7,187,070 B2 | 3/2007 | Chu et al. | |
| 7,757,392 B2 * | 7/2010 | Otremba | 29/840 |
| 7,868,440 B2 | 1/2011 | Roberts et al. | |
| 2002/0011907 A1 | 1/2002 | Yamada et al. | |
| 2002/0020925 A1 | 2/2002 | Kishimoto et al. | |
| 2003/0140489 A1 | 7/2003 | Kishimoto et al. | |
| 2003/0151471 A1 | 8/2003 | Yamada et al. | |
| 2004/0014257 A1 | 1/2004 | Kim et al. | |
| 2004/0173891 A1 | 9/2004 | Imai et al. | |
| 2004/0251531 A1 | 12/2004 | Yang et al. | |
| 2005/0082656 A1 | 4/2005 | Chu et al. | |
| 2005/0110126 A1 | 5/2005 | Wu | |
| 2005/0184377 A1 | 8/2005 | Takeuchi et al. | |
| 2005/0199996 A1 | 9/2005 | Ho | |
| 2005/0205982 A1 | 9/2005 | Kawano | |
| 2005/0275084 A1 | 12/2005 | Kirby et al. | |
| 2006/0091521 A1 | 5/2006 | Cady et al. | |
| 2006/0110849 A1 | 5/2006 | Lee et al. | |
| 2006/0131716 A1 | 6/2006 | Cady et al. | |
| 2006/0192277 A1 | 8/2006 | RaghuRam | |
| 2006/0201997 A1 | 9/2006 | Tung | |
| 2006/0220220 A1 | 10/2006 | Nakagawa et al. | |
| 2007/0063332 A1 | 3/2007 | Go et al. | |
| 2007/0075415 A1 | 4/2007 | Osumi | |
| 2007/0114653 A1 | 5/2007 | Shiono et al. | |
| 2007/0152328 A1 | 7/2007 | Jadhav et al. | |
| 2007/0158813 A1 | 7/2007 | Kim | |
| 2007/0207569 A1 | 9/2007 | Greenberg et al. | |
| 2007/0222055 A1 | 9/2007 | Jensen et al. | |
| 2007/0254404 A1 | 11/2007 | Gerber et al. | |
| 2007/0259514 A1 * | 11/2007 | Otremba | 438/612 |
| 2007/0266558 A1 * | 11/2007 | Otremba | 29/840 |
| 2008/0036071 A1 | 2/2008 | Li et al. | |
| 2008/0079132 A1 | 4/2008 | Goodwin | |
| 2008/0150123 A1 | 6/2008 | Li et al. | |
| 2011/0260313 A1 * | 10/2011 | Yim et al. | 257/676 |

OTHER PUBLICATIONS

Riley, George A., Flip Chip Interconnection for Detector Arrays, 6 pages, Jul. 2001, <http://www.flipchips.com/tutorial10.html>.

Riley, George A., Gold Stud Bump Applications, 6 pages, Nov. 2002, <http://www.flipchips.com/tutorial24.html>.

Riley, George A., Gold stud bump update, 6 pages, Mar. 2005, <http://www.flipchips.com/tutorial50.html>.

Riley, George A., Micro-Posts: Tall, Slender, Stud Bumps, 3 pages, Apr. 2003, <http://www.flipchips.com/tutorial29.html>.

Riley, George A., Stud Bump Flip Chip, 4 pages, Dec. 2000,<http://www.flipchips.com/tutorial03.html>.

Thermosonic Flip Chip Assembly, 7 pages, Jun. 2001, <http://www.flipchips.com/tutorial09.html>.

* cited by examiner

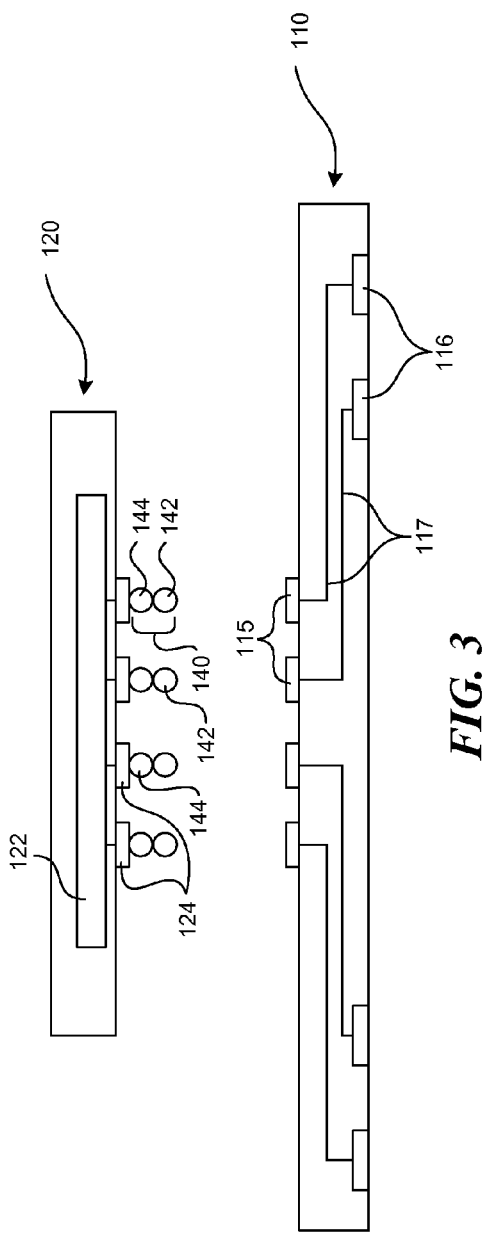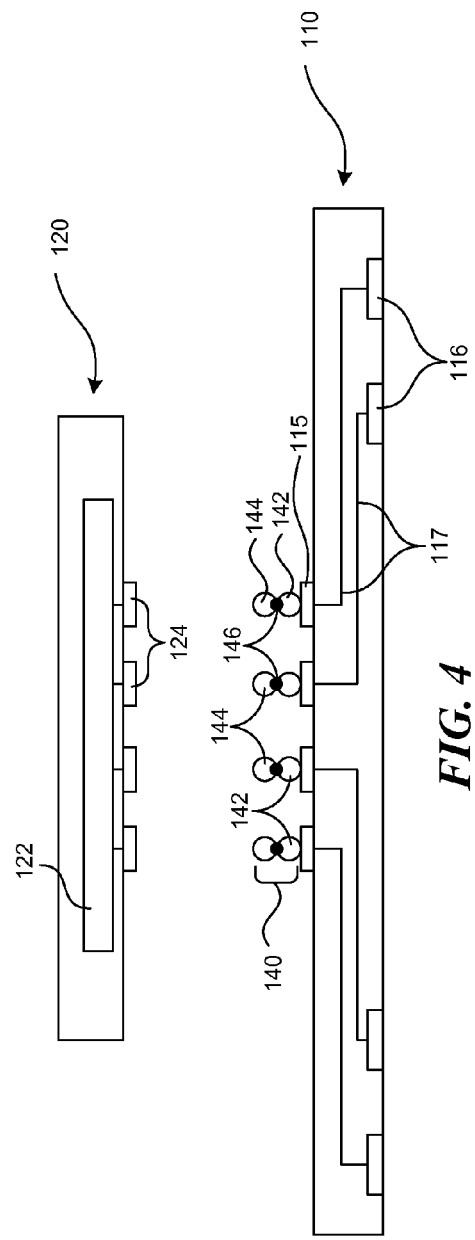

PACKAGED MICRODEVICES AND METHODS FOR MANUFACTURING PACKAGED MICRODEVICES

CROSS-REFERENCE TO RELATED APPLICATION

This application is a divisional of U.S. application Ser. No. 11/509,990 filed Aug. 25, 2006, now U.S. Pat. No. 7,868,440, which is incorporated herein by reference in its entirety.

TECHNICAL FIELD

The present invention is related to microdevices and methods for packaging microdevices using gold-to-gold interconnects or other types of conductive elements in high-density contact arrays.

BACKGROUND

Microelectronic devices generally have a die (i.e., a chip) that includes integrated circuitry having a high density of very small components. In a typical process, a large number of dies are manufactured on a single wafer using many different processes that may be repeated at various stages (e.g., implanting, doping, photolithography, chemical vapor deposition, plasma vapor deposition, plating, planarizing, etching, etc.). The dies typically include an array of very small bond-pads electrically coupled to the integrated circuitry. The bond-pads are the external electrical contacts on the die through which the supply voltage, signals, etc., are transmitted to and from the integrated circuitry. The dies are then separated from one another (i.e., singulated) by dicing the wafer and backgrinding the individual dies. After the dies have been singulated, they are typically "packaged" to couple the bond-pads to a larger array of electrical terminals that can be more easily coupled to the various power supply lines, signal lines, and ground lines.

Electronic products require packaged microelectronic devices to have an extremely high density of components in very limited space. For example, the space available for memory devices, processors, displays, and other microelectronic components is quite limited in cellphones, PDAs, portable computers, storage devices, media players and many other products. As such, there is a strong drive to reduce the surface area or "footprint" of a microelectronic device on a printed circuit board, lead frame, or other type of substrate. Reducing the size of a microelectronic device is difficult because high performance microelectronic dies generally have more bond-pads that result in larger ball-grid arrays and thus larger footprints.

"Flip-chip" packages are attractive for such high performance, small microelectronic devices. These devices are referred to as "flip-chips" because they are typically manufactured on a wafer and have an active side with bond-pads that initially face upward. After completing the die, it is singulated and inverted or "flipped" such that the active side bearing the bond-pads faces downward for attachment to a substrate. The bond-pads are usually coupled to terminals, such as conductive "bumps," that electrically and mechanically connect the die to the substrate. The bumps on the flip-chip are generally formed from solder, conductive polymers, or other materials. When the bumps are made from solder, they are reflowed to form discrete solder joints between the flip-chip component and the substrate. This leaves a small gap between the die and the substrate. To enhance the integrity of the joint between the die and the substrate, an underfill material is generally introduced into the gap. The underfill material bears some of the stress placed on the components and protects the components from moisture, chemicals, and other contaminants. The underfill material can include filler particles to increase the rigidity of the material and modify the coefficient of thermal expansion of the material.

Most flip-chip devices use a lead-tin solder that requires flux to remove oxide during assembly. Although lead-tin solders provide high yields and reliable connections, soldering generally involves potentially hazardous materials and presents other challenges. First, it is generally costly and inefficient to handle hazardous materials. Second, the temperatures of reflow processes may be above the upper limits for some of the materials used in the packages. Third, solder interconnects are relatively large compared to gold-to-gold interconnects. Many solder-based flip-chip packages accordingly require a redistribution layer on the die that redistributes the very fine pitch of the bond-pads to an array having a larger pitch to accommodate the solder interconnects.

Gold-to-gold interconnects are one alternative to solder interconnects. Gold-to-gold interconnects generally have gold stud bumps placed on the die bond-pads through a modification of the "ball bonding" process used in conventional wire-bonding. In ball bonding, the tip of the gold bond wire is melted to form a sphere, and the bonding tool presses this sphere against a bond-pad while applying mechanical force, heat and ultrasonic energy to create a metallic connection. The gold is broken just above the ball to form a gold ball or "gold stud bump" on the bond-pad. After placing the gold stud bumps on a chip, they may be flattened by mechanical pressure to provide a flat-top surface and uniform bump height (i.e., co-planarity). Gold stud bumps are relatively easy to form with conventional wire-bonding equipment, and they do not use hazardous materials that require expensive and sophisticated handling processes. Gold stud bumps can also be quite small, and are thus very useful for fine pitch arrays with a large number of very small bond-pads.

Gold stud bumps, however, have only been used in limited applications because it is challenging to use them in many types of packaged devices. For example, because gold stud bumps are quite small, they must have good co-planarity and there must be good parallelism between the die and substrate to obtain good diffusion bonding. Misalignment between the die and the substrate, or non-uniform bump heights, may cause openings in the interconnects. As a result, gold stud bumps are not used in high density arrays on laminate substrates formed from organic dielectric materials. Additionally, large arrays require more ultrasonic power and greater down forces to attach the gold stud bumps to the bond-pads, and this can damage the dies. Therefore, it would be desirable to develop a packaged device and a method for packaging devices in which gold stud bumps can be formed in large arrays on organic substrates or other types of substrates to enable gold interconnects to be used in a wider range of applications.

BRIEF DESCRIPTION OF THE DRAWINGS

FIG. 2A is a schematic side cross-sectional view of a substrate with first conductive elements and a die with second conductive elements at one stage of a method for packaging microdevices in accordance with the invention.

FIG. 2B is a schematic side cross-sectional view in which the die is inverted such that the first conductive elements are aligned with the second conductive elements.

FIG. 2C is a schematic side cross-sectional view of the substrate and the die after connecting the first conductive elements to the second conductive elements.

FIG. 3 is a schematic side cross-sectional view illustrating a stage in another embodiment of a method for packaging microdevices in accordance with the invention.

FIG. 4 is a schematic side cross-sectional view illustrating a stage in still another embodiment of a method for packaging microdevices in accordance with the invention.

DETAILED DESCRIPTION

A. Overview

Figure 1:
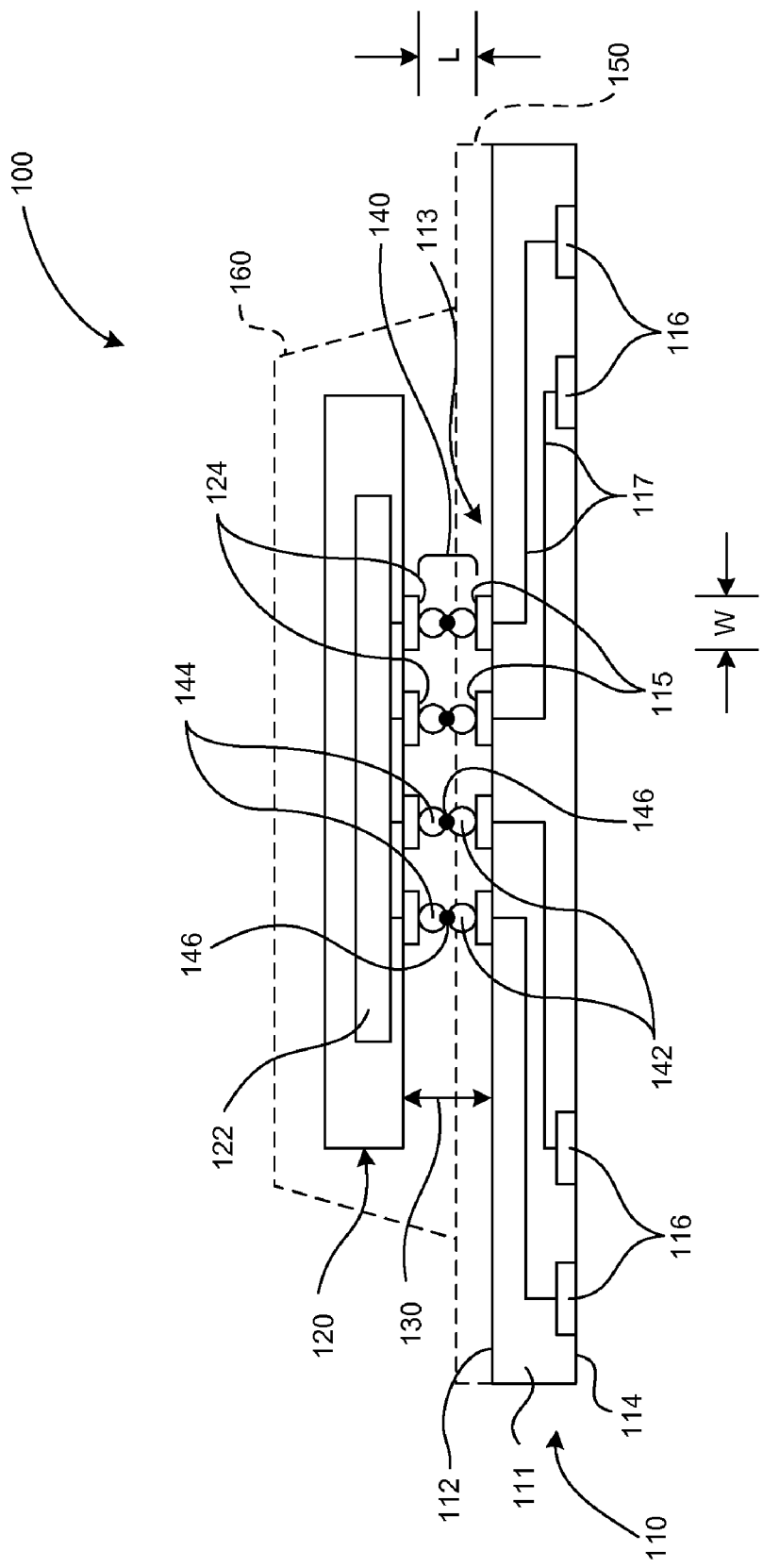
FIG. 1 is a schematic side cross-sectional view of a packaged microdevice in accordance with an embodiment of the invention.

The following disclosure describes several embodiments of microdevices and methods for packaging microdevices. One embodiment of a packaged microdevice comprises a substrate having a mounting area, contacts in the mounting area, and external connectors electrically coupled to corresponding contacts. The microdevice also includes a die located across from the mounting area and spaced apart from the substrate by a gap. The die has an integrated circuit and pads electrically coupled to the integrated circuit. The microdevice further includes first and second conductive elements in the gap that form interconnects between the contacts of the substrate and corresponding pads of the die. The first conductive elements are electrically connected to contacts on the substrate, and the second conductive elements are electrically coupled to corresponding pads of the die. The first conductive elements are attached to the second conductive elements at corresponding interfaces such that the interconnects connect the contacts of the substrate directly to corresponding pads on the die within the gap.

In several embodiments, the first conductive elements comprise first gold bumps deposited onto the contacts of the substrate, and the second conductive elements comprise second gold bumps deposited onto the pads of the die. The interfaces can comprise ultrasonic joints or other fixed joints (e.g., welds) between corresponding first and second gold bumps. In additional embodiments, the substrate can further comprise an organic dielectric material and conductive traces electrically coupling the contacts to corresponding external connectors. In many embodiments, the pads on the die are juxtaposed to corresponding contacts on the substrate and the first gold bumps are superimposed with corresponding second gold bumps such that the interconnects couple the pads to the contacts without a redistribution structure on the die between the pads and the contacts.

In another embodiment, a packaged microelectronic device comprises a substrate having a mounting area, contacts in the mounting area, and external connectors electrically coupled to the contacts. The packaged device can further include a die located across from the mounting area and spaced apart from the substrate by a gap. The die has pads and an integrated circuit electrically coupled to the pads. The packaged device further includes gold interconnects in the gap between the substrate and the die. The individual interconnects have a first cross-sectional dimension at the contacts and a length between the contacts and the die that is greater than the cross-sectional dimension.

Another aspect of the invention is directed towards methods for packaging a microelectronic device. One embodiment of such a method includes arranging a plurality of first gold elements in a pattern corresponding to a pattern of contacts on a substrate, and attaching the first gold elements to corresponding second gold elements. The individual pairs of first and second gold elements form individual interconnects. Additionally, the first gold elements are attached to contacts of the substrate, and the second gold elements are attached to corresponding pads of a microelectronic die.

In one specific example, the first gold elements are arranged in the pattern corresponding to the pattern of contacts on the substrate by depositing first gold bumps onto the contacts of the substrate. In this embodiment, the second gold elements comprise second gold bumps, and the method further comprises depositing the second gold bumps onto the pads of the dies. The method can further comprise attaching the first gold bumps to corresponding second gold bumps after the second gold bumps have been deposited onto the pads.

In a different embodiment, the first gold elements are arranged in the pattern corresponding to the pattern of contacts on the substrate by forming first gold bumps on the contacts of the substrate. The first gold elements can be attached to corresponding second gold elements by depositing second gold bumps onto the first gold bumps, and then the method can further comprise attaching the second gold bumps to corresponding pads of the die after attaching the first gold bumps to the second gold bumps.

In an alternative embodiment, the second gold bumps are deposited onto the pads of the die before attaching the first gold bumps to the second gold bumps, and then the first gold bumps are then attached to the second gold bumps. The contacts of the substrate are attached to the first gold bumps after the first gold bumps have been attached to the second gold bumps.

Another embodiment of a method of packaging a microelectronic device comprises forming a plurality of first gold elements on contacts of a substrate, and forming a plurality of second gold elements in electrical connection with pads of a microelectronic die. The method further includes aligning the first gold elements with corresponding second gold elements, and attaching the first gold elements to the second gold elements to form electrical interconnects between the substrate and the die.

Still another embodiment of a method of packaging a microelectronic device comprises providing a substrate having an organic dielectric material, contacts arranged in an array in a mounting area, and external connectors electrically coupled to the contacts. The method further includes providing a microelectronic die having pads arranged in an array corresponding to the contact array and an integrated circuit electrically coupled to the pads. The method further includes attaching a plurality of the first gold elements to a plurality of second gold elements, attaching the first gold elements to corresponding contacts, and attaching the second gold elements to corresponding pads. The individual pairs of first and second gold elements comprise individual interconnects between the substrate and the die.

Specific details of several embodiments of the invention are described below with reference microelectronic devices with a single microelectronic die attached to a substrate. However, in other embodiments, the microelectronic devices can have two or more stacked microelectronic dies electrically coupled to a substrate. The microelectronic devices can be processors, memory devices (DRAM, SDRAM, flash, etc.), imagers, sensors, filters (SAW filters) or other types of devices that require an electrical connection between the dies and a substrate. Several details describing well-known structures or processes often associated with fabricating microelectronic dies and devices are not described herein for purposes of brevity. Also, several of the embodiments of the invention can have different configurations, components, or procedures than those described in this section. A person of ordinary skill in the art, therefore, will accordingly understand that the invention may have other embodiments with additional elements, or that the invention may have other embodiments without several of the elements and features shown and described below with reference to FIGS. 1-4.

B. Embodiments of Packaged Microdevices

FIG. 1 is a schematic side cross-sectional view of a packaged microelectronic device 100 in accordance with an embodiment of the invention. In this embodiment, the packaged device 100 includes a substrate 110, a die 120 spaced apart from the substrate 110 by a gap 130, and a plurality of interconnects 140 electrically coupling the die 120 to the substrate 110. The individual interconnects 140 can include a first conductive element 142 electrically coupled to the substrate 110 and a second conductive element 144 electrically coupled to the die 120. As explained in more detail below, the first and second conductive elements 142 and 144 are separate components that are attached to each other at interfaces 146. The first and second conductive elements 142 and 144 can be gold bumps or other small conductive elements that can fit in the gap 130 between the substrate 110 and the die 120 to electrically connect the die 120 directly to the substrate 110 without a redistribution structure on the die 120. The first and second conductive elements 142 and 144 also combine to have a standoff height or length that mitigates the need to have (a) highly uniform bump heights and (b) parallelism between the substrate 110 and the die 120. Therefore, as explained in more detail below, the features and advantages of the interconnects 140 enable gold-to-gold interconnects or other small interconnects to be used in a wide range of applications that are currently limited to solder-based interconnects.

The substrate 110 includes a dielectric material 111 having a die surface 112 with a mounting area 113 and an external surface 114. The substrate 110 further includes a plurality of contacts 115 in the mounting area 113, external connectors 116 at the external surface 114, and electrical traces 117 between the contacts 115 and corresponding external connectors 116. The dielectric material 111 can be an organic material, a ceramic material, or another suitable dielectric material. In many applications, the traces 117 are copper lines on layers of an organic dielectric material 111 that are laminated together.

The die 120 can be a semiconductor die or other type of microelectronic die. In many applications, the die 120 has an integrated circuit 122 and a plurality of pads 124 electrically coupled to the integrated circuit 122. The pads 124 can be external bond-pads as shown in FIG. 1, or the pads 120 can be embedded in the die 120 and connected to the interconnects 140 by through-wafer interconnects. The die 120 can be a processor, a memory device, an imager, a sensor, a filter, or other type of microelectronic device. Suitable memory devices, for example, include DRAM and flash memory devices.

In the embodiment of the packaged microdevice 100 shown in FIG. 1, the contacts 115 are arranged in a contact array, and the pads 124 are arranged in a pad array that mirrors the contact array. The die 120 is positioned relative to the substrate 110 such that individual pads 124 are aligned with corresponding individual contacts 115 across the gap 130. The pads 124 are accordingly juxtaposed or otherwise superimposed relative to corresponding contacts 115. In other embodiments, the contact array may be a universal array with a large number of contacts such that the array of pads 124 is juxtaposed to only a subset of the contacts 115 on the substrate 110.

The first conductive elements 142 are electrically connected to the contacts 115 of the substrate 110, and the second conductive elements 144 are electrically coupled to corresponding pads 124 of the die 120. Individual first conductive elements 142 are attached to corresponding individual second conductive elements 144 at interfaces 146 such that individual pairs of first and second conductive elements 142 and 144 form the direct interconnects 140 in the gap 130 between the contacts 115 and corresponding pads 124. As a result, in many embodiments the multi-bump interconnects 140 electrically couple the pads 124 to the contacts 115 without constructing a redistribution layer on the die 120. The first conductive elements 142 can be gold bumps, and the second conductive elements 144 can be gold bumps formed separately from the first gold bumps 144. The first conductive elements 142 and second elements 144, moreover, can be attached at the interfaces 146 such that the interconnects 140 have a length "L" between the contacts 115 and corresponding pads 124 that is greater than a cross-sectional dimension "W" at the contacts 115 and/or the pads 124.

The packaged microdevice 100 can further include an optional resist layer 150 (shown in broken lines) on the die surface 112 of the substrate 110 with an opening (not shown) in which the contacts are located. The packaged device 100 can further include an optional casing 160 molded around the die 120 to protect the die 120 from external hazards. In several embodiments, the packaged device 100 can further include an under fill material in the gap 130 to protect the interconnects 140 when the casing 160 is molded around the die 120.

Figure 2A:
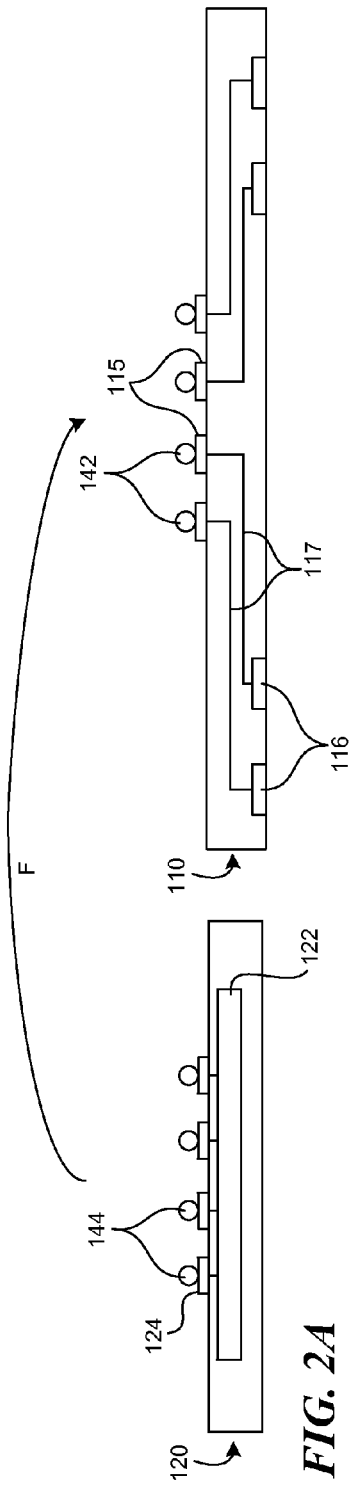
FIGS. 2A-2C illustrate stages in a method for packaging a microdevice in accordance with an embodiment of the invention.
Figure 2B:
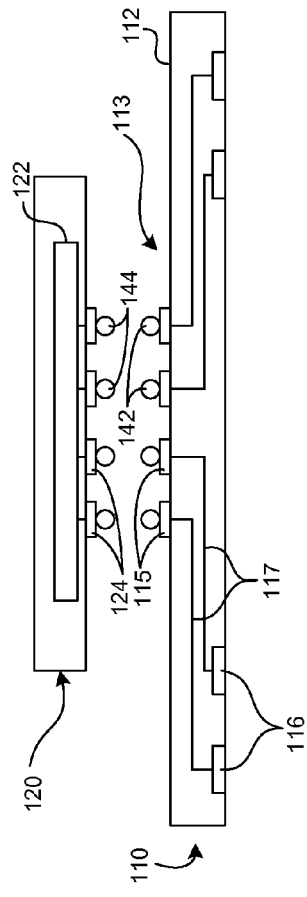
Figure 2C:
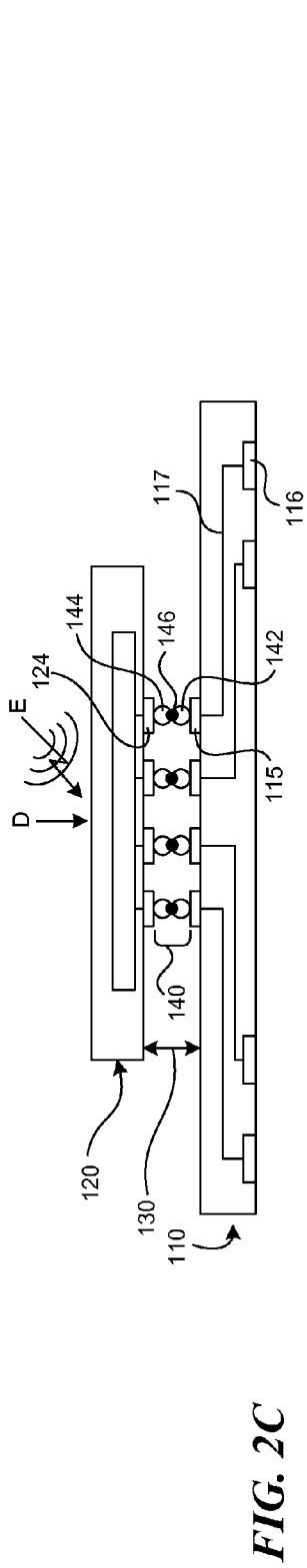

FIGS. 2A-2C are schematic side cross-sectional views illustrating different stages of a method for fabricating the packaged microdevice 100 in accordance with an embodiment of the invention. Like references numbers refer to like components in FIGS. 1-2C. Referring to FIG. 2A, this embodiment of the method includes depositing the first conductive elements 142 onto the contacts 115 and depositing the second conductive elements 144 onto the pads 124. The first and second conductive elements 142 and 144 are accordingly separate components in this embodiment such that the first conductive elements 142 are attached to the contacts 115 and the second conductive elements 144 are attached to the pads 124 before the first and second conductive elements 142 and 144 are connected to each other. The first conductive elements 142 can be first gold stud bumps and the second conductive elements 144 can be second gold stud bumps. In one embodiment, the first and second gold stud bumps are formed using a wire bonding machine by forming a gold sphere at the tip of the wire, attaching the sphere to the contact 115 or pad 124, and severing the sphere from the wire. This stage of the method further includes flipping the die 120 (arrow F) to invert the die 120 over the substrate 110 for further processing. In an alternative embodiment, the substrate 110 can be flipped to be inverted over the die 120.

FIG. 2B illustrates a stage after which the die 120 has been flipped to be inverted over the substrate 110. At this stage, the method includes aligning the pads 124 with corresponding contacts 115 such that the first conductive elements 142 face corresponding second conductive elements 144. The method continues by moving die 120 and/or the substrate 110 toward each other until the first conductive elements 142 contact corresponding second conductive elements 144.

FIG. 2C illustrates a stage at which the first conductive elements 142 contact corresponding second conductive elements 144. At this stage, the method continues by applying a down force (arrow D) to the die 120 while transmitting an energy (arrow E) to the first and second conductive elements 142 and 144. The down force and energy form a fixed joint at the interfaces 146 between the first conductive elements 142 and corresponding second conductive elements 144. The energy can be ultrasonic energy or heat such that the interface 146 is a diffusion joint between the first conductive elements 142 and corresponding second conductive elements 144. Individual pairs of first and second conductive elements 142 and 144 accordingly form direct interconnects between the contacts 115 and the pads 124. After connecting the first elements 142 to the second elements 144, an under fill material may be placed in the gap 130 and a casing may be molded over the die 120 to further protect the die 120.

One advantage of several embodiments of the packaged device 100 is that the multi-bump interconnects 140 with two or more stacked bumps provide a standoff height between the substrate 110 and the die 120. This can compensate for non-uniformities in the height/lengths of the interconnects and/or a lack of parallelism between the die 120 and the substrate 110. The larger standoff height accordingly enables laminates and other types of non-ceramic substrates to be used with gold-to-gold interconnects or other types of small interconnects in flip-chip applications. As a result, the advantages of using a gold interconnect or other type of small, lead-free interconnect for environmental purposes can be realized in applications that use laminated substrates and/or high density arrays with high pin counts.

Another advantage of several embodiments of the packaged device 100 illustrated in FIGS. 1-2C is that the first and second conductive elements 142 and 144 can be formed of gold balls or other small, conductive stud bumps that are much smaller than solder balls. This enables flip-chip interconnection between very fine pitched bond-pad arrays on a die and corresponding contact arrays on a substrate without having to use a redistribution layer. It will be appreciated that redistribution layers have dielectric layers, conductive traces and additional pads to effectively increase the spacing between the pads to a larger array on the die. The direct connection provided by the interconnects 140, however, eliminates the need to effectively space the pads apart by a greater distance. As such, several embodiments of the packaged device 100 eliminate the costs and time for manufacturing redistribution layers on wafers.

Still another advantage of several embodiments of the packaged device 100 illustrated in FIG. 1 is that the design of the dies is not restricted to bond-pad arrangements that can be wire bonded or need a redistribution layer to be coupled to the substrate. This enables higher pin counts and/or smaller packages. As a result, high performance devices can have relatively small packages for use in cell phones, PDAs, portable computers and other products where space is a premium.

The specific embodiment in which the first conductive elements 142 are attached to the second conductive elements 144 only after the first conductive elements have been deposited onto the contacts 115 and the second conductive elements 144 have been deposited onto the pads 124 is expected to provide better diffusion bonding between the first and second conductive elements 142 and 144. More specifically, the down force used to connect the conductive elements together (see FIG. 2C) can be less because the slip interface between the first and second conductive elements 142 and 144 forms a stronger diffusion joint when the first and second conductive elements 142 and 144 are first attached to the substrate 110 and the die 120, respectively. This is expected to reduce or otherwise mitigate damage caused to the die 120 during the attaching stage illustrated in FIG. 2C.

C. Additional Embodiments of Packaged Microdevices

FIG. 3 is a schematic side cross-sectional view illustrating a die 120 being attached to a substrate 110 to form a packaged device in accordance with another method of the invention. Like reference numbers refer to like components in FIGS. 1-3. In the embodiment illustrated in FIG. 3, the second conductive elements 144 are deposited onto the pads 124 of the die 120, and then the first conductive elements 142 are attached to the second conductive elements 144 to form multi-bump interconnects 140 on the die 120. The die 120 is then inverted as shown in FIG. 3 to align the interconnects 140 with corresponding contacts 115 of the substrate. The first conductive elements 142 are then attached to corresponding contacts 115 of the substrate 110 by applying a down force and an appropriate energy to the interconnects 140.

FIG. 4 is a schematic side cross-sectional view illustrating a stage in forming a packaged device in accordance with another method of the invention. In this embodiment, the first conductive elements 142 are deposited onto the contacts 115 and then the second conductive elements 144 are attached to the first conductive elements 142 to form multi-bump interconnects 140 on the substrate 110. The die 120 is then positioned such that the pads 124 are aligned with corresponding multi-bump interconnects 140. The substrate 110 and/or the die 120 are then moved toward each other until the second conductive elements 144 contact corresponding pads 124 of the die 120. The appropriate down force and energy are then applied to the interconnects to attach the second conductive elements 144 to corresponding pads 124.

From the foregoing, it will be appreciated that specific embodiments of the invention have been described herein for purposes of illustration, but that various modifications may be made without deviating from the spirit and scope of the invention. For example, the illustrated interconnects have two separate conductive elements, but in other embodiments, the individual interconnects can have three or more conductive elements. Additionally, the flip-chip interconnects can be used between stacked dies in a stacked die arrangement. Accordingly, the invention is not limited except as by the appended claims.

We claim:

1. A method of packaging a microelectronic device, comprising:

arranging a plurality of first gold elements in a pattern corresponding to a pattern of contacts on a substrate; and attaching the first gold elements to corresponding second gold elements by forming diffusion joints between them, such that individual pairs of first and second gold elements form individual interconnects, wherein the first gold elements are attached to contacts of the substrate and the second gold elements are attached to corresponding pads of a microelectronic die, and with at least one of the individual interconnects directly under the microelectronic die and in a gap between the microelectronic die and the substrate.

2. The method of claim 1 wherein:

arranging the first gold elements comprises depositing first gold bumps onto the contacts of the substrate;

the second gold elements comprise second gold bumps and the method comprises depositing the second gold bumps onto the pads of the dies; and attaching the first gold elements to corresponding second gold elements comprises joining the first gold bumps to corresponding second gold bumps after the second gold bumps have been deposited onto the pads and with the first and second gold bumps separately identifiable after forming the diffusion joint.

3. The method of claim 1 wherein:
arranging the first gold elements comprises forming first gold bumps on the contacts of the substrate; and
attaching the first gold elements to corresponding second gold elements comprises depositing second gold bumps onto the first gold bumps, contacting the second gold bumps to corresponding pads of the die after depositing the second gold bumps on the first gold bumps, and transmitting an energy to the first and second gold bumps.

4. The method of claim 2 wherein:
the first gold elements comprise first gold bumps and the second gold elements comprise second gold bumps; and
the method comprises (a) depositing the second gold bumps onto the pads of the die, (b) attaching the first gold bumps to the second gold bumps after depositing the second gold bumps on the pads, and (c) attaching the contacts of the substrate to the first gold bumps after attaching the first gold bumps to the second gold bumps.

5. The method of claim 2 wherein:
arranging the first gold elements in a pattern corresponding to a pattern of the contacts comprises depositing first gold bumps onto corresponding contacts of the substrate;
the second gold elements comprise second gold bumps and the method further comprises depositing the second gold bumps onto the pads of the die; and
attaching the first gold elements to the second gold elements comprises aligning the first gold bumps with corresponding second gold bumps, pressing the first gold bumps and second gold bumps together, and transmitting ultrasonic energy to the first and second gold bumps.

6. The method of claim 5 wherein the substrate comprises an organic dielectric material, external connectors, and traces electrically coupling the contacts with the external connectors, and wherein the method further comprises connecting the first gold elements to the contacts.

7. The method of claim 2 wherein the contacts are arranged in a contact array and the pads are arranged in a pad array the same as the contact array, and the method further comprises aligning the contact array with the pad array such that the first and second gold elements directly connect the contacts to corresponding pads without redistributing the pad array to a larger intermediate array.

8. A method of packaging a microelectronic device, comprising:
providing a plurality of first conductive elements on contacts of a substrate, wherein the substrate has external connectors electrically coupled to the contacts;
providing a plurality of second conductive elements on pads of a microelectronic die, wherein the pads are electrically coupled to an integrated circuit in the die;
aligning the first conductive elements with corresponding second conductive elements; and
attaching the first conductive elements directly to the second conductive elements by forming diffusion joints between them, at interfaces within a gap between the substrate and the die to form electrical interconnects in the gap, and with at least one of the interconnects underlying the die.

9. The method of claim 8 wherein providing the plurality of first conductive elements comprises depositing a first set of gold bumps on the contacts of the substrate, and wherein providing the plurality of second conductive elements comprises depositing a second set of gold bumps on the pads of the die.

10. The method of claim 9 wherein attaching the first conductive elements to the second conductive elements comprises pressing the first set of gold bumps against corresponding second set of gold bumps and transmitting energy to the first and second sets of gold bumps to form fixed joints at the interfaces between the first and second gold bumps, and with the first and second gold bumps separately identifiable after formation of the fixed joints.

11. The method of claim 10 wherein the energy comprises ultrasonic energy.

12. The method of claim 8 wherein aligning the first conductive elements with corresponding second conductive elements comprises inverting the die such that the second conductive elements face corresponding first conductive elements, and the method further comprises pressing the first conductive elements against corresponding second conductive elements.

13. The method of claim 8 wherein the substrate comprises an organic dielectric material, external connectors, and traces electrically coupling the contacts with the external connectors, and wherein forming the plurality of first conductive elements comprises depositing first gold bumps onto the contacts of the substrate and forming a plurality of second conductive elements comprises depositing second gold bumps onto the pads of the die.

14. The method of claim 13 wherein attaching the first conductive elements to the second conductive elements comprises pressing the first gold bumps against the second gold bumps and transmitting ultrasonic energy to the first and second gold bumps to form ultrasonic joints at the interfaces.

15. A method of packaging a microelectronic device, comprising:
providing a substrate having an organic dielectric material, contacts arranged in an array in a mounting area, and external connectors electrically coupled to the contacts;
providing a microelectronic die having pads arranged in an array corresponding to contacts on the substrate and an integrated circuit electrically coupled to the pads;
attaching first conductive gold elements to contacts on the substrate;
attaching second conductive gold elements to pads on the die;
attaching the first conductive gold elements to the second conductive gold elements by forming a diffusion joint between them, and with the first and second conductive gold elements substantially separately identifiable after forming the diffusion joints;
wherein individual pairs of first and second conductive elements comprise individual interconnects under the die and between the substrate and the die.

16. The method of claim 15 further including forming the first conductive gold elements by depositing first gold bumps on the contacts of the substrate, and forming the second conductive gold elements by depositing second gold bumps on the pads of the die.

17. The method of claim 16 wherein attaching the first conductive elements to the second conductive elements comprises pressing the first gold bumps against corresponding second gold bumps and transmitting an energy to the first and second gold bumps that forms fixed joints at the interfaces between the first and second gold bumps.

18. The method of claim 16 wherein transmitting the energy comprises directing ultrasonic energy to the first and second gold bumps.

19. The method of claim 16 wherein aligning the first conductive elements with corresponding second conductive elements comprises inverting the die such that the second conductive elements face corresponding first conductive elements, and the method further comprises pressing the first conductive elements against corresponding second conductive elements.

20. The method of claim 16 wherein the substrate comprises an organic dielectric material, external connectors, and traces electrically coupling the contacts with the external connectors, and wherein forming the plurality of first conductive elements comprises depositing first gold bumps onto the contacts of the substrate and forming a plurality of second conductive elements comprises depositing second gold bumps onto the pads of the die.

21. The method of claim 15 wherein attaching the first conductive elements to the second conductive elements comprises pressing the first gold bumps against the second gold bumps and transmitting ultrasonic energy to the first and second gold bumps to form ultrasonic joints at the interfaces.

22. The method of claim 1 wherein substantially all of the interconnects are directly under the microelectronic die.

23. The method of claim 8 wherein substantially all of the interconnects are under the die.

* * * * *